United States Patent
Kim et al.

(10) Patent No.: US 9,105,746 B2
(45) Date of Patent: Aug. 11, 2015

(54) METHOD FOR MANUFACTURING A FIELD EFFECT TRANSISTOR OF A NON-PLANAR TYPE

(71) Applicant: IMEC VZW, Leuven (BE)

(72) Inventors: Min-Soo Kim, Leuven (BE); Guillaume Boccardi, Sint-Lambrechts-Woluwe (BE); Soon Aik Chew, Leuven (BE); Naoto Horiguchi, Leuven (BE)

(73) Assignee: IMEC VZW, Leuven (BE)

(*) Notice: Subject to any disclaimer, the term of this patent is extended or adjusted under 35 U.S.C. 154(b) by 0 days.

(21) Appl. No.: 14/521,083

(22) Filed: Oct. 22, 2014

(65) Prior Publication Data

US 2015/0111351 A1    Apr. 23, 2015

(30) Foreign Application Priority Data

Oct. 22, 2013 (EP) .................................. 13189609

(51) Int. Cl.
*H01L 21/8238* (2006.01)
*H01L 29/66* (2006.01)
(Continued)

(52) U.S. Cl.
CPC .. *H01L 21/823821* (2013.01); *H01L 21/02126* (2013.01); *H01L 21/76205* (2013.01); *H01L 21/82385* (2013.01);
(Continued)

(58) Field of Classification Search
CPC ............ H01L 29/66795; H01L 29/785; H01L 29/66545; H01L 29/1094; H01L 29/6656; H01L 29/6681; H01L 29/0653; H01L 21/82385; H01L 21/76205; H01L 21/02126
USPC ......................................... 438/157, 176, 283
See application file for complete search history.

(56) References Cited

U.S. PATENT DOCUMENTS

| 7,479,421 B2 | 1/2009 | Kavalieros et al. |
| 7,892,945 B2 | 2/2011 | Bedell et al. |

(Continued)

FOREIGN PATENT DOCUMENTS

| DE | 102011004506 A1 | 8/2012 |
| WO | 2008/039495 A1 | 4/2008 |

OTHER PUBLICATIONS

European Search Report, European Patent Application No. 13189609.4, dated Mar. 18, 2014, 6 pages.

*Primary Examiner* — Thanhha Pham
(74) *Attorney, Agent, or Firm* — McDonnell Boehnen Hulbert & Berghoff LLP (57) ABSTRACT

A method for manufacturing a field effect transistor of a non-planar type, comprising providing a substrate having an initially planar front main surface, and providing shallow trench isolation structures in the substrate on the front surface, thereby defining a plurality of fin structures in the substrate between the shallow trench isolation structures. Top surfaces of the shallow trench isolation structures and the fin structures abut on a common planar surface, and sidewalls of the fin structures are fully concealed by the shallow trench isolation structures. The method also includes forming a dummy gate structure over a central portion of the plurality of fin structures on the common planar surface, forming dielectric spacer structures around the dummy gate structure, and removing the dummy gate structure, thereby leaving a gate trench defined by the dielectric spacer structures. Further, the method includes removing an upper portion of at least two shallow trench isolation structures to expose at least a portion of the sidewalls of the fin structures within the gate trench, and forming a final gate stack in the gate trench.

12 Claims, 8 Drawing Sheets

(51) Int. Cl.
*H01L 29/06* (2006.01)
*H01L 21/02* (2006.01)
*H01L 21/762* (2006.01)
*H01L 29/78* (2006.01)
*H01L 29/10* (2006.01)

(52) U.S. Cl.
CPC ... *H01L 21/823878* (2013.01); *H01L 29/0653* (2013.01); *H01L 29/1054* (2013.01); *H01L 29/6656* (2013.01); *H01L 29/6681* (2013.01); *H01L 29/66545* (2013.01); *H01L 29/66795* (2013.01); *H01L 29/7851* (2013.01)

(56) References Cited

U.S. PATENT DOCUMENTS

| | | | |
|---|---|---|---|
| 8,273,626 | B2 | 9/2012 | Hareland et al. |
| 2005/0280102 | A1 | 12/2005 | Oh et al. |
| 2012/0313170 | A1 | 12/2012 | Chang et al. |
| 2013/0001591 | A1 | 1/2013 | Wu et al. |
| 2013/0153997 | A1 | 6/2013 | Chang et al. |
| 2013/0168771 | A1 | 7/2013 | Wu et al. |
| 2013/0175623 | A1 | 7/2013 | Chang et al. |
| 2013/0181299 | A1 | 7/2013 | Baldauf et al. |
| 2013/0187206 | A1 | 7/2013 | Mor et al. |
| 2014/0065802 | A1* | 3/2014 | Chang et al. .................. 438/479 |

* cited by examiner

METHOD FOR MANUFACTURING A FIELD EFFECT TRANSISTOR OF A NON-PLANAR TYPE

CROSS-REFERENCE TO RELATED APPLICATION

This application claims priority to European Patent Application No. 13189609.4 filed on Oct. 22, 2013, the contents of which are hereby incorporated by reference.

FIELD OF THE DISCLOSURE

The present disclosure relates to a method for manufacturing field effect transistor devices of a non-planar type, and more particularly to field effect transistor devices of a fin type.

BACKGROUND TO THE DISCLOSURE

Fin field effect transistor (FinFET) devices have fast switching times and high current densities, and are often a desired transistor device architecture. A FinFET device typically comprises a source, a drain and one or more fin-shaped channels between the source and the drain. A gate electrode positioned over the fin(s) regulates electron flow between the source and the drain and is often defined by optical lithography.

FinFETS may be fabricated by following either a gate first or gate last approach. In the gate last approach, a dummy gate is initially used to pattern the source and drain (S/D) regions. Following the dummy gate patterning and S/D formation, interlayer dielectric (ILD) deposition is carried out to fill in between the fins and the gates. Then, the dummy gate is removed followed by replacement gate patterning.

As feature sizes of the FinFET devices get increasingly smaller, accurately and consistently defining the device features becomes more difficult. Scaling fin or channel width is another challenge for FinFET manufacturing. For schemes where the fins are formed before gate patterning, thin fins must survive gate (possibly removable or dummy gate) and spacer processing, which often involve aggressive etching processes.

The manufacturing of FinFET structures, which are 3D-structures, involves different types of processes which are topography-dependent. Examples of such processes are material deposition or growth processes, especially epitaxial growth processes, etching or other removal processes, illumination or irradiation, implantation processes, etc. The efficiency of these processes typically deteriorates when topography increases.

In the future, the integration of 2D transistor structures with 3D transistor structures may be required. The dependency of manufacturing steps to topography, for instance expressed as dependency on aspect ratio of device features, would require a relatively independent processing of 2D and 3D devices, which is complex and costly, such that solutions in this field are rare or non-existing.

Typical FinFET processing requires certain processing steps at elevated temperatures, for instance when performing a source/drain anneal step. This limits the choice of materials used therein.

Currently, there is also a need for manufacturing methods which allow the integration of different channel materials as, for example, Si channel, SiGe channel, Ge channel, and III-V channel materials.

In US patent application US2012/0313170 A1 (Chang), a method for fabrication of FinFET devices is disclosed. Chang discloses providing patterned hard mask on an active layer on top of a buried oxide layer of a silicon on insulator substrate, the patterned hard mask defining eventual fin regions. Then a dummy gate is placed over the fin hard mask. Later in the fabrication process, the dummy gate is removed, thereby revealing the underlying fin hard mask and active layer. The fin hard mask is then used to pattern the fins within the active layer. The hard mask has relatively large thickness, such that the presence thereof during the FinFET processing introduces a relatively large topography.

SUMMARY OF THE DISCLOSURE

The present disclosure to provides a method for manufacturing a field effect transistor of a non-planar type (often also called 3D-type), which helps to address at least one of the above mentioned problems.

In one aspect, a method for manufacturing a field effect transistor of a non-planar type includes:

a. providing a substrate having an initially planar front main surface, for instance a blanket silicon wafer;

b. providing shallow trench isolation (STI) structures in the substrate on the front surface, thereby defining a plurality of fin structures in the substrate in between the shallow trench isolation structures, wherein top surfaces of the shallow trench isolation structures and the fin structures are abutting on a common planar surface, and wherein the sidewalls of the fin structures are fully concealed (e.g., covered) by the shallow trench isolation structures;

c. forming a dummy gate structure over a central portion of the plurality of fin structures on the common planar surface;

d. forming dielectric spacer structures around (and adjacent to) the dummy gate structure (defining the lateral sidewalls of an eventual gate structure);

e. removing the dummy gate structure, thereby leaving a gate trench defined by the dielectric spacer structures, preferably leaving the sidewalls of the fin structures fully concealed (e.g., covered) by the shallow trench isolation structures; and f. thereafter, removing an upper portion of at least two shallow trench isolation structures to expose at least a portion of the sidewalls of the fin structures within the gate trench, thereby for instance defining the height of the fin;

g. thereafter, forming a final gate stack in the gate trench.

According to disclosed embodiments, the method further comprises depositing a protection layer, as for instance an ILD (interlayer dielectric), and thereafter planarizing the front surface of the wafer, for instance by means of a CMP (Chemical Mechanical Polishing) process, after forming dielectric spacer structures and before removing the dummy gate structure. During the planarizing step the HM (hard mask) over the gate may also be removed to expose a top of the dummy gate.

It may be recognized that the method for manufacturing a field effect transistor is of a "gate-last" type, or of a "Replacement Gate (RG)" type.

Methods for providing shallow trench isolation structures are known to the skilled person. A typical process may, for instance, comprise etching a pattern of trenches in a bulk silicon substrate, depositing one or more dielectric materials (such as silicon nitride and/or silicon dioxide) to fill the trenches, and removing the excess dielectric material, for instance by using a planarization technique, such as chemical-mechanical planarization.

The portions of the fin structure(s) outside of the dummy gate structure may serve as a source and a drain region of a transistor. The part or region of the fin structure in between the source and drain regions is referred to as the channel or channel region of a transistor. The fin structure is suitable to allow a transistor current to flow.

It is a possible advantage of embodiments of the present disclosure that by postponing the "3D-step" or "becoming 3D" of the fin structures, e.g., postponing the exposing of at least a portion of the sidewalls of the fin structures, such as an upper portion, the fin structures do not contribute to increase of topography before that moment in time. This can help to enhance the efficiency and workability of other processing steps that are topography (or aspect ratio) dependent, when compared to the case where the fin structures are protruding or extending from the substrate, and thus contribute substantially to topography, from the beginning.

According to disclosed embodiments, removing an upper portion of at least two shallow trench isolation structures to expose at least a portion of the sidewalls of the fin structures within the gate trench, comprises removing the upper 5 nm or more, for instance about the upper 30 nm, up until the full STI depth of the STI structures adjacent to the respective fin structure.

It may be a further advantage that the fin structures, in their as-defined state, for instance directly after the STI process, comprise abrupt angles between their upper surface and their side surfaces or sidewalls. While keeping the fin structures covered or embedded by the dielectric, further processing steps will not substantially impact these abrupt angles. If the sidewalls or side surfaces would indeed be exposed to these further processing steps, as is occurring typically in the prior art, these abrupt angles would be affected and possibly rounded off, which may negatively impact the reproducibility and/or eventual characteristics of the fin structures. Indeed, in the prior art, tapered or bottle shaped fin structures can be a result of the following:

after completion of the STI process, the field oxide needs to be densified. This can be performed for instance by wet oxidation at 750° C. under an atmosphere comprising $O_2+H_2O$; this results in an oxidation of the sidewalls and top of the fins up to 1-2 nm thickness; and also, gate oxidation is done by thermal oxidation, which also consumes silicon from the Si fi.

A dummy gate structure can for instance comprise a silicon oxide layer and a polycrystalline silicon layer on top of the silicon oxide layer (dummy gate oxide layer). When the polycrystalline silicon layer is removed, preferably by means of a wet removal, the dielectric layer or silicon oxide layer can serve as a barrier.

When removing the dummy gate structure, thereby leaving a gate trench defined by the dielectric spacer structures, the top surface and sidewalls of the fin structures remain fully concealed (e.g., covered) by the shallow trench isolation structures and the dielectric layer, for instance, a silicon oxide layer, of the dummy gate structure. The upper or top surface of the fin structures can be uncovered in a subsequent step, by removing the dummy gate oxide.

According to disclosed embodiments, the fin structures initially comprise a first semiconductor material, the method further comprising removing an upper portion from the fin structures (hereby, the upper portion of the silicon fin is replaced by a III-V layer or stack of layers, or a germanium layer, or a germanium comprising layer, or a germanium comprising stack of layers, that may comprise or embody a strain relaxed buffer [SRB]. The upper portion of the fin which is removed can for instance comprise a portion in between the upper 5 nm and the portion corresponding to full depth of the STI oxide) and epitaxially regrowing the upper portion of the fin structures by epitaxially growing a second semiconductor material, before removing the upper portion of the at least two shallow trench isolation structures. According to disclosed embodiments, an interface layer is provided on the underlying silicon structure of the fin, such as by epitaxial growth, before epitaxially growing the second semiconductor material.

It is a further possible advantage of these embodiments, that by postponing the exposing of at least a portion of the sidewalls of the fin structures, and thus keeping the topography more flat for a longer time, at least an upper portion of the fin structure can be replaced with a different fin material. Indeed the presence of the STI up until a later moment in the FinFET manufacturing process allows the epitaxial growth of fin materials that would not have been usable otherwise. Such an epitaxial growth can benefit from Aspect Ratio Trapping (ART) effects.

According to disclosed embodiments, the substrate may be a bulk substrate as for instance a bulk silicon or germanium substrate, or any other substrate deemed suitable by the skilled person.

According to disclosed embodiments, the common planar surface has a surface profile variation that is smaller than 10 nm, smaller than 5 nm, or smaller than 3 nm. It is a potential advantage that the smaller the common planar surface profile variation, the less topography is present and the better the performance and controllability of aspect-ratio dependent process steps becomes. It will be appreciated that typical hard masks that would be provided on a main surface of a blank wafer, would be provided with a larger thickness and would result in a surface profile variation that may be larger than 10 nm.

Moreover, it will be recognized that fin structures typically have a height that is about three times its width. This can also be the case for embodiments of the present disclosure, but it is believed that aspects of the present disclosure allow a relatively larger fin height than in the state of the art, which can be an important advantage. The fin height can for instance be larger than four times, five times, or ten times its width. The height can be freely or more freely chosen in view of optimal device characteristics. Indeed, the state of the art rule of thumb is based on considerations for SOI substrates, the fact that the dummy gate has to be removed from a surface with a substantial topography, and the complexity of conformal doping of source and drain when there is substantial topography. For instance, for the present generation (N10-10 nm node): finHeight/finWidth=30 nm/10 nm; For N7 (7 nm node): finH/finW=30 nm/7 nm.

According to disclosed embodiments, the method comprises performing further aspect ratio dependent processing steps before removing the dummy gate structure. Aspect ratio dependent processing steps can be for instance any or any combination of deposition steps and/or etching steps and/or illumination steps and/or implantation steps.

According to disclosed embodiments, performing further aspect ratio dependent processing steps before removing the dummy gate structure comprises forming unwanted structures on the substrate at locations different from the spacer structures defining the gate structure around the dummy gate structure, and selectively removing the unwanted structures with respect to the dielectric spacer structures around the dummy gate structure.

According to disclosed embodiments, the method further comprises applying a protection layer on the substrate, before removing the dummy gate structure, the protection layer being substantially more resistant to an etching process used for recessing STI structures (etching the upper part thereof).

According to disclosed embodiments, the method further comprises applying a protection layer on the substrate, before removing the dummy gate structure, the protection layer being substantially more resistant to an etching process used for removing the dummy gate structure.

According to disclosed embodiments, the protection layer comprises a carbon comprising silicon oxide layer.

According to embodiments of a second aspect of the present disclosure, the above described methods can be performed in parallel, i.e. at the same time, for a set of different field effect transistor structures having respective gate structures, wherein the gate pitch (pitch between gates of neighboring transistors) and fin pitch (pitch between fins of a single transistor) are different and defined by scaling.

Normally, the active pitch (=fin pitch) and gate pitch are different, and are often determined to maximize the packing density using the most advanced patterning techniques. For instance, a node can have a 45 nm fin pitch and a 110 nm gate pitch; and a next generation node can still have 45 nm fin pitch but 62 nm gate pitch. It will be appreciated by the skilled person that the 'effective aspect ratio' that is defined by the ratio of horizontal opening distance between neighboring lines over the vertical distance from the top surface to the bottom surface, along a direction for the structure of interest (e.g. fin or gate), can be kept relatively small in embodiments of the present disclosure.

According to embodiments of a third aspect of the present disclosure, a method for manufacturing a CMOS device is disclosed, comprising performing the method according to any of the embodiments of the first or second aspects in a first area, and performing the method according to any of the embodiments of the first or second aspects in a second area, the first area and the second area being distinct. The method further comprising removing an upper portion from the fin structures and epitaxially regrowing the upper portion of the fin structures by epitaxially growing a second semiconductor material, before removing the upper portion of the at least two shallow trench isolation structures, in at least one of the first area and the second area.

According to embodiments of a third aspect of the present disclosure, the method comprises removing an upper portion from the fin structures and epitaxially regrowing the upper portion of the fin structures by epitaxially growing a second semiconductor material, before removing the upper portion of the at least two shallow trench isolation structures, in both the first area and the second area.

According to disclosed embodiments, the second semiconductor material comprises Germanium or a III-V material. In embodiments whereby epitaxially regrowing the upper portion of the fin structures is applied in both first and second areas, the second semiconductor material in the first area can comprise germanium and the second semiconductor material in the second area (or third semiconductor material) can comprise III-V material, or vice versa.

BRIEF DESCRIPTION OF THE DRAWINGS

Further features of the present disclosure will become apparent from the drawings, wherein FIGS. 1 to 8 illustrate process flows according to embodiments of the present disclosure.

FIGS. 1 to 4 illustrate the process flow common to embodiments of a first type and of a second type of the present disclosure.

DETAILED DESCRIPTION

The present disclosure will be described with respect to particular embodiments and with reference to certain drawings but the disclosure is not limited thereto but only by the claims. The drawings described are only schematic and are non limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun, such as "a," "an," or "the," this includes a plural of that noun unless something else is specifically stated.

The term "comprising," used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present disclosure, the only relevant components of the device are A and B.

Furthermore, the terms first, second, third, and the like in the description and in the claims, are used for distinguishing between similar elements and not necessarily for describing a sequential or chronological order. It is to be understood that the terms so used are interchangeable under appropriate circumstances and that the embodiments of the disclosure described herein are capable of operation in other sequences than described or illustrated herein.

Moreover, the terms top, bottom, over, under, and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

In the drawings, like reference numerals indicate like features; and, a reference numeral appearing in more than one figure refers to the same element.

FIGS. 1 to 4 illustrate the process flow common to embodiments of a first type and of a second type of the present disclosure. In each figure, the upper left portion shows a top view of respective fin and gate structures, for respective PMOS and NMOS devices. Each of the figures also depicts vertical cross-sectional views along directions indicated along lines B-B', b-b', A-A' and a-a'.

The present description discloses a method for manufacturing a field effect transistor of a non-planar type, e.g., of the FinFET type.

Figure 1:
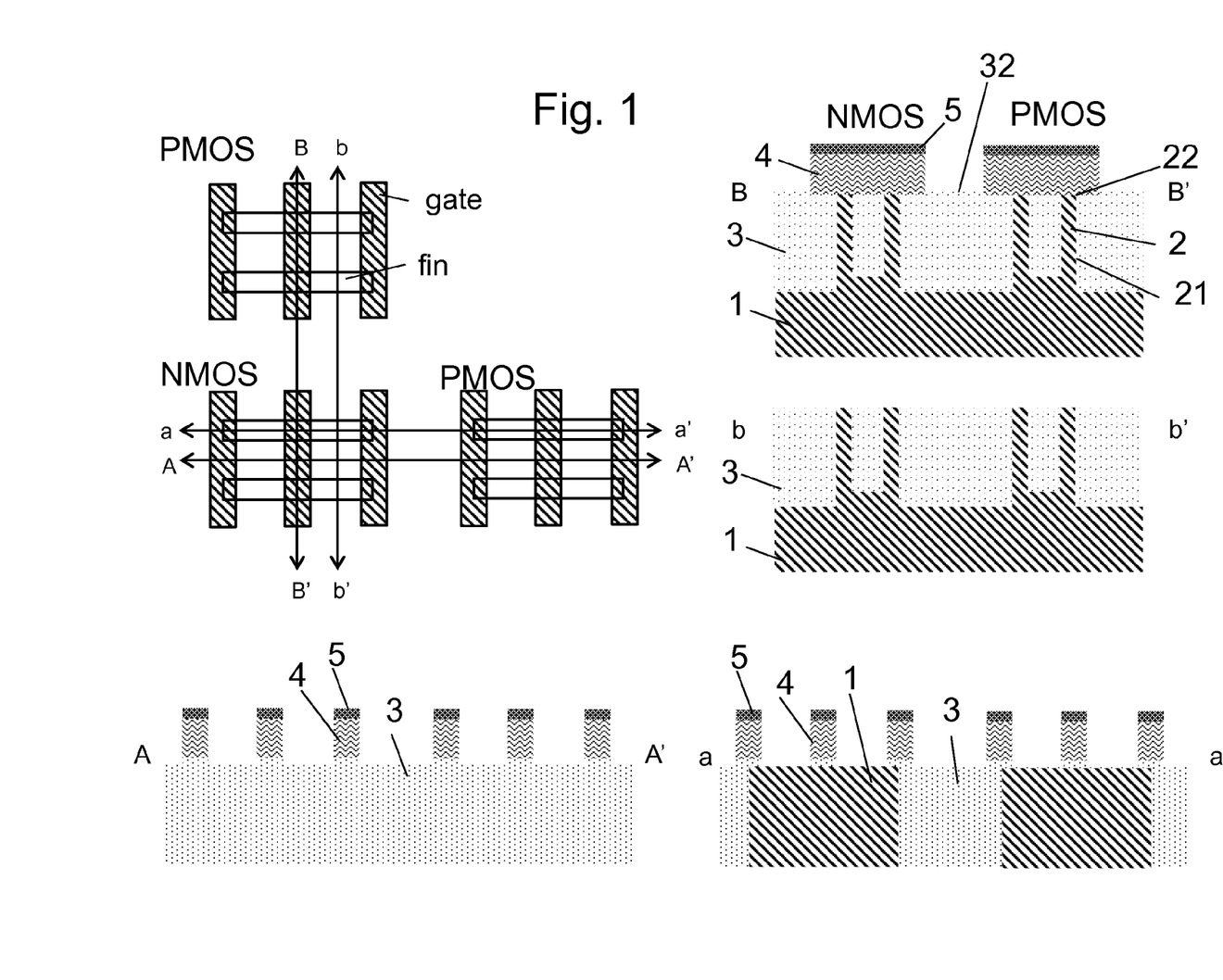

In FIG. 1, a bulk substrate 1 is provided with shallow trench isolations (STI), as it is known to the skilled person. Hereby a plurality of fin structures 2 is defined in the substrate, in between these shallow trench isolation structures. Preferably, top surfaces 22 of the shallow trench isolation structures and the fin structures are abutting on a common planar surface 32. The sidewalls 21 of the fin structures are fully concealed by the shallow trench isolation structures. It will be appreciated by the skilled person that a small surface profile variation or surface topography of the substrate can initially be present for the common planar surface. For instance, a surface profile variation of about 3 nm can be foreseen for the common planar surface, for instance in view of the fact that a pre-clean is typically performed before dummy gate oxide deposition, which is done by using a HF based chemistry that removes also part of the STI. Therefore, for instance about 3 nm, or substantially 3 nm, of topography can be foreseen on the STI (e.g., the upper surface of the STI regions can extend above the upper surface of the fin structures) according to certain embodiments of the present disclosure to compensate for the possible STI loss during this above mentioned cleaning step.

For instance, a silicon substrate 1 can be provided, having an initially planar front main surface. Isolation trenches are then formed. On top of the trenches, one or more dielectric material layers (such as silicon nitride and/or silicon dioxide) are provided, to thereby fill the trenches and form isolation structures 3. Excess dielectric material is then removed, for instance by using a planarization technique such as chemical-mechanical planarization, resulting in a common planar surface 32. Protrusions which are left after the trench etching, e.g., which are in between the isolation structures, can serve as fin structures 2. Alternatively, for instance, one or more dielectric layers can be deposited on a main surface of a bulk substrate 1. Within these dielectric layer(s) 3, trenches can be etched at locations corresponding to the location of the fin structures 2. Within these trenches, a fin layer material can be epitaxially grown, to thereby form fin structures 2. The trenches can be overgrown and a planarization technique, such as a CMP process, can be applied in order to provide a common planer surface 32.

Then, a dummy gate structure 4, comprising, for instance, a dummy gate oxide (not depicted) and a polycrystalline dummy gate layer, is provided over a central portion of the plurality of fin structures 2 on the common planar surface 32. A portion of a hard mask layer 5 used for defining the dummy gate structure, can still be present on top of the dummy gate structures.

The dummy gate oxide can be formed by dry oxidation. The thickness of the dummy gate oxide may be less than 10 nm, less than 5 nm, or less than 3 nm.

A polysilicon dummy gate can be deposited for instance with a thickness between about 80 nm and about 200 nm. The polysilicon dummy gate can have a reduced thickness, for instance, a thickness of about 80 nm, just before an RMG module is applied; indeed, the rest of the thickness may be consumed during intermediate processing.

Figure 2:
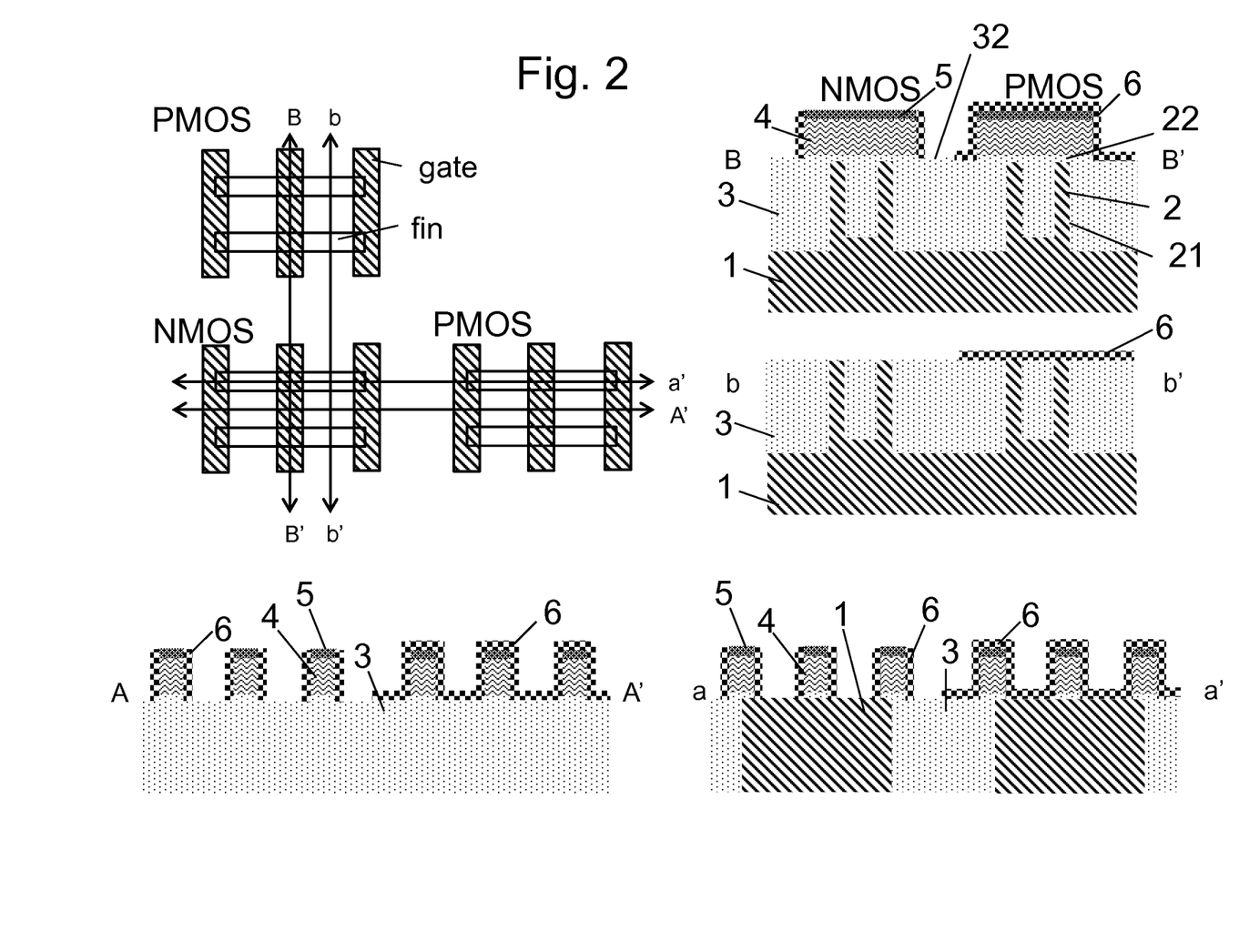
Figure 3:
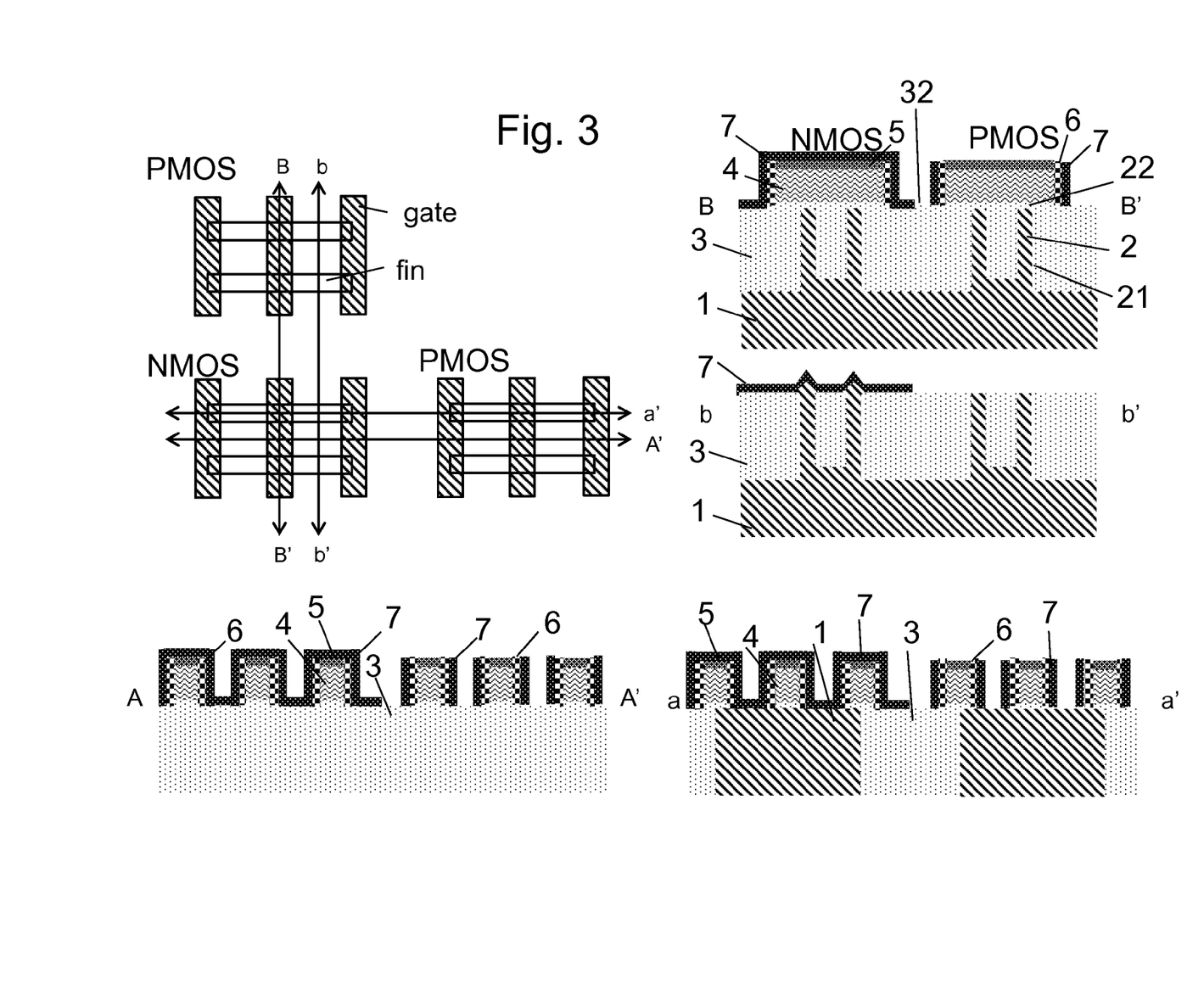

Afterwards, spacer structures 6, 7 are formed around the dummy gate structure 4, as is known by the skilled person, as depicted in FIGS. 2 and 3. These spacer structures 6, 7 can be, preferably selectively, deposited or grown on the fin structures 2. The spacer structures can alternatively also be defined by providing a layer of spacer material and using a lithography process. Spacer structures can for instance comprise SiN, such as applied by means of LPCVD or PECVD, or other state of the art materials used in spacer structures for FINFET devices, such as low-k materials. Often, while forming these spacer structures 6, 7 according to the prior art, deposition and/or growth also takes place on other locations on the substrate, for instance along exposed fin structures 2, more specifically along the sidewalls 21 of such exposed fin structures. The spacer material may then need to be selectively removed on these other locations, which is relatively easy in embodiments of the present disclosure when compared to prior art fin structures 2, where the device already has a certain level of topography by having exposed sidewalls of the fin structures.

Figure 4:
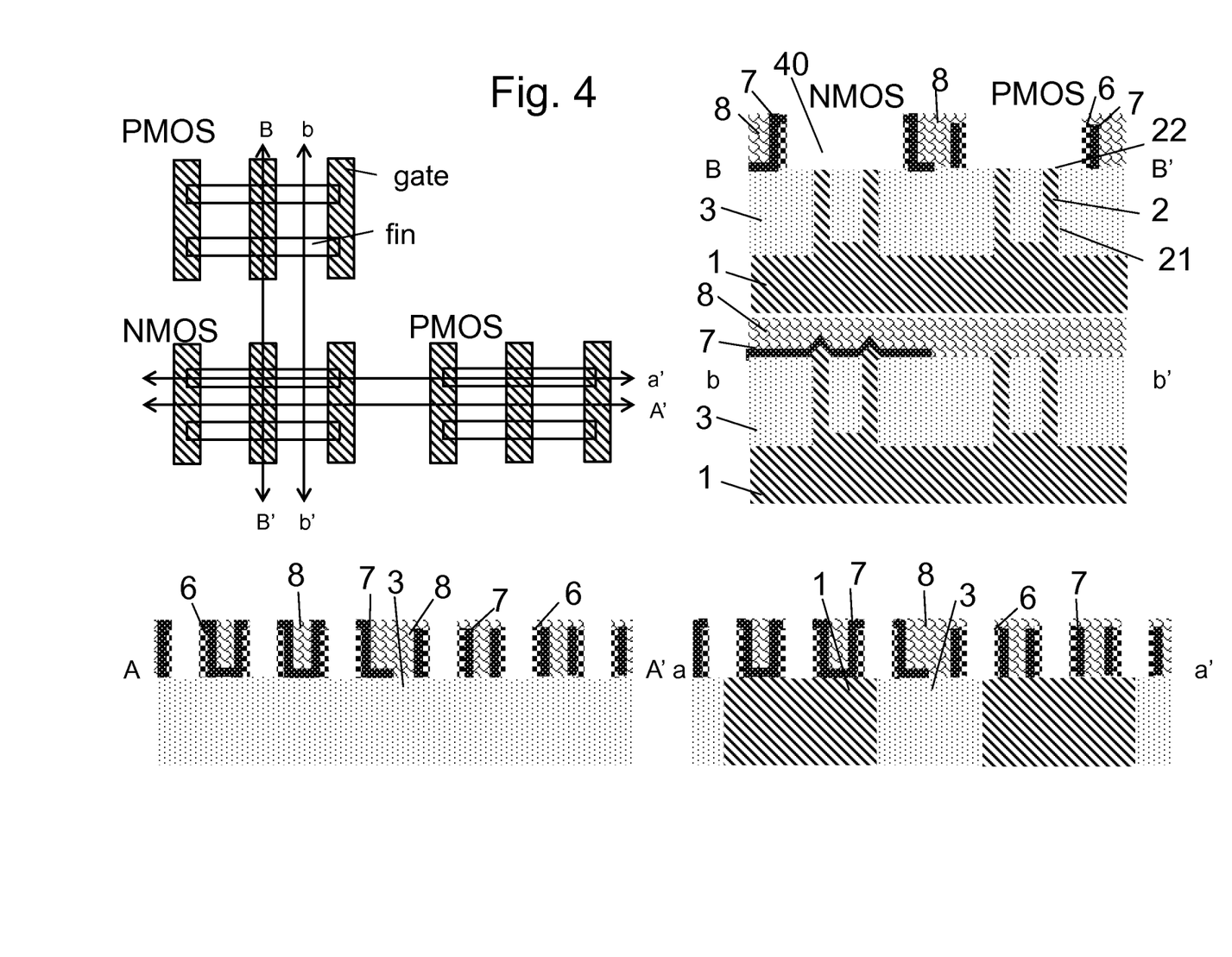

Next, as illustrated in FIG. 4, a protection layer 8 is provided over the substrate, to protect the substrate and elements thereon from the etching step that is used later for removing the dummy gate structure 4. The protection layer 8 is selected and configured to be substantially more resistant to an etching process used for removing the dummy gate structure 4.

The protection layer can comprise a flowable oxide layer. It can comprise a carbon comprising silicon oxide layer, which provides a good resistance to HF etching. For instance, the protection layer can be an intra layer dielectric layer (ILD). The protection layer may be suitable for withstanding a fin recess process, and may be suitable to provide an acceptable conformity to fill in space between gates. The protection layer may be resistant to HF etching, which is typically used to perform the STI recessing. The protection layer can for instance be applied by or comprise materials used in the Applied Materials Flowable CVD (FCVD) process. The protection layer can be applied by or comprise materials used in a new Sequential Profile Modulation (SPM) process technology from Novellus Systems Inc. Alternatively, the protection layer can be a nitride layer.

Typically, after providing the protection layer, a Chemical Mechanical Polishing step can be applied, preferably opening up the dummy gate structure 4, e.g., exposing the upper surface of the dummy gate. The upper surface is hereby planarized, and near the end of the process the hard mask 5 that is present on top of the dummy gate is also removed.

Afterwards, the dummy gate structure 4 is removed, for instance by means of etching, thereby leaving a gate trench 40 defined by the dielectric spacer structures 6, 7. The dummy gate can be removed either by wet etch or by dry etch. Dry etch can be performed by gas clustered ion beam (GCIB). Wet etch may be preferred and can be performed by using TMAH chemistry, which is very selective to gate oxide and does not have detrimental effects for device performance.

The gate trench preferably exposes the top dummy gate oxide on respective fin structures 2, while leaving the sidewalls 21 of the fin structures 2 unexposed or covered by the dielectric material 3 of the shallow trench isolation structures.

The dummy gate oxide can be removed in a, preferably separate, further step.

Figure 5:
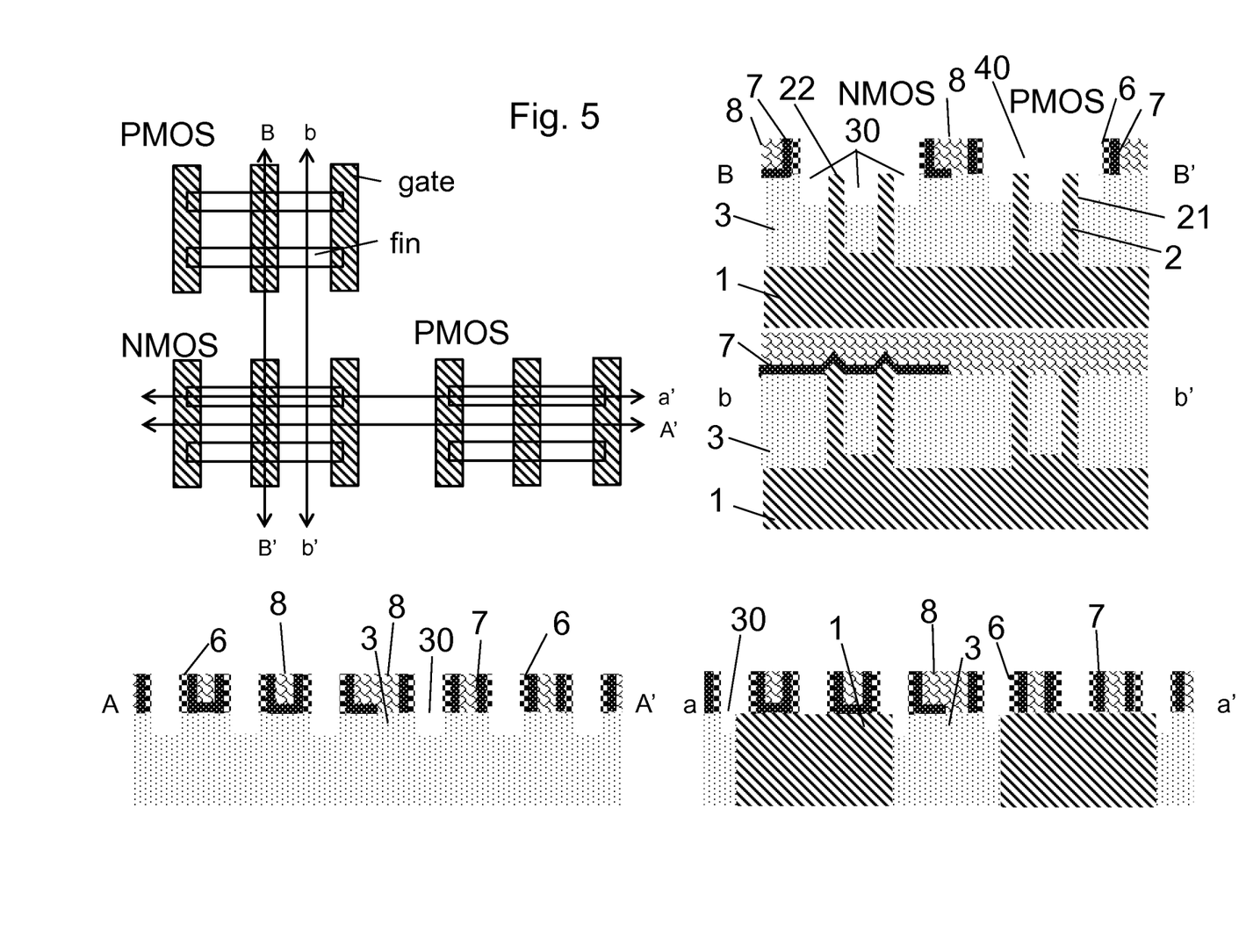
FIG. 5 illustrates the process flow according to embodiments of a first type of the present disclosure.

According to a first type of embodiment, illustrated in FIG. 5, an upper portion of at least two shallow trench isolation structures is now removed to expose at least a portion of the sidewalls 21 of the fin structures, as they were originally defined, within the gate trench 40. This can be performed by applying a HF treatment, or by applying a HF and Silicon cobalt-nickel ("Siconi") treatment, or by applying only a Siconi treatment, which are processes known to the skilled person.

It is a possible advantage that the fin structures become "3-dimensional" (3D) only at this later stage of the manufacturing process, such that they do not protrude from the substrate before, and thus do not contribute to the non-flat topography of the substrate during processing.

Figure 6:
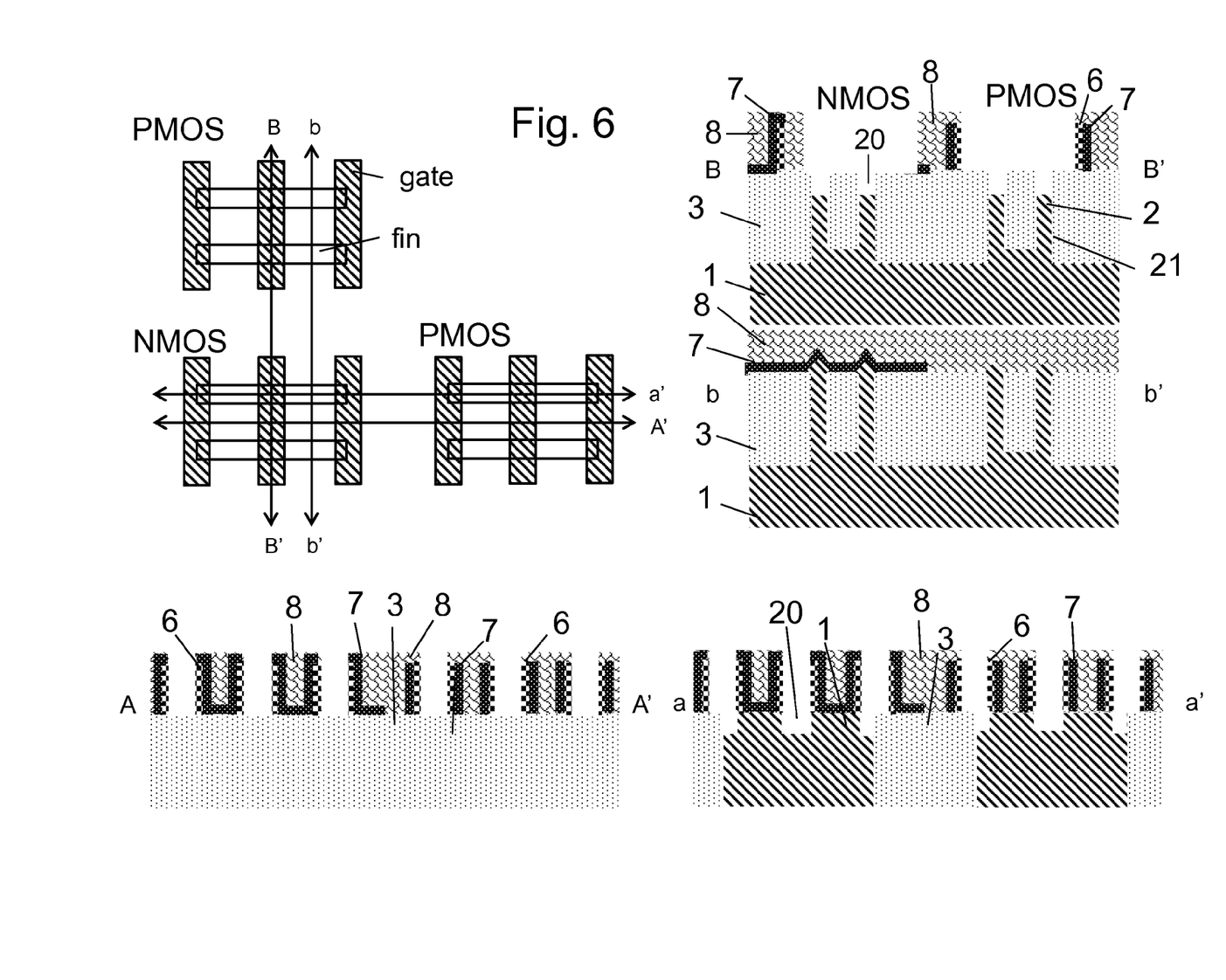
FIGS. 6 to 8 illustrate the process flow according to embodiments of a second type of the present disclosure.
Figure 7:
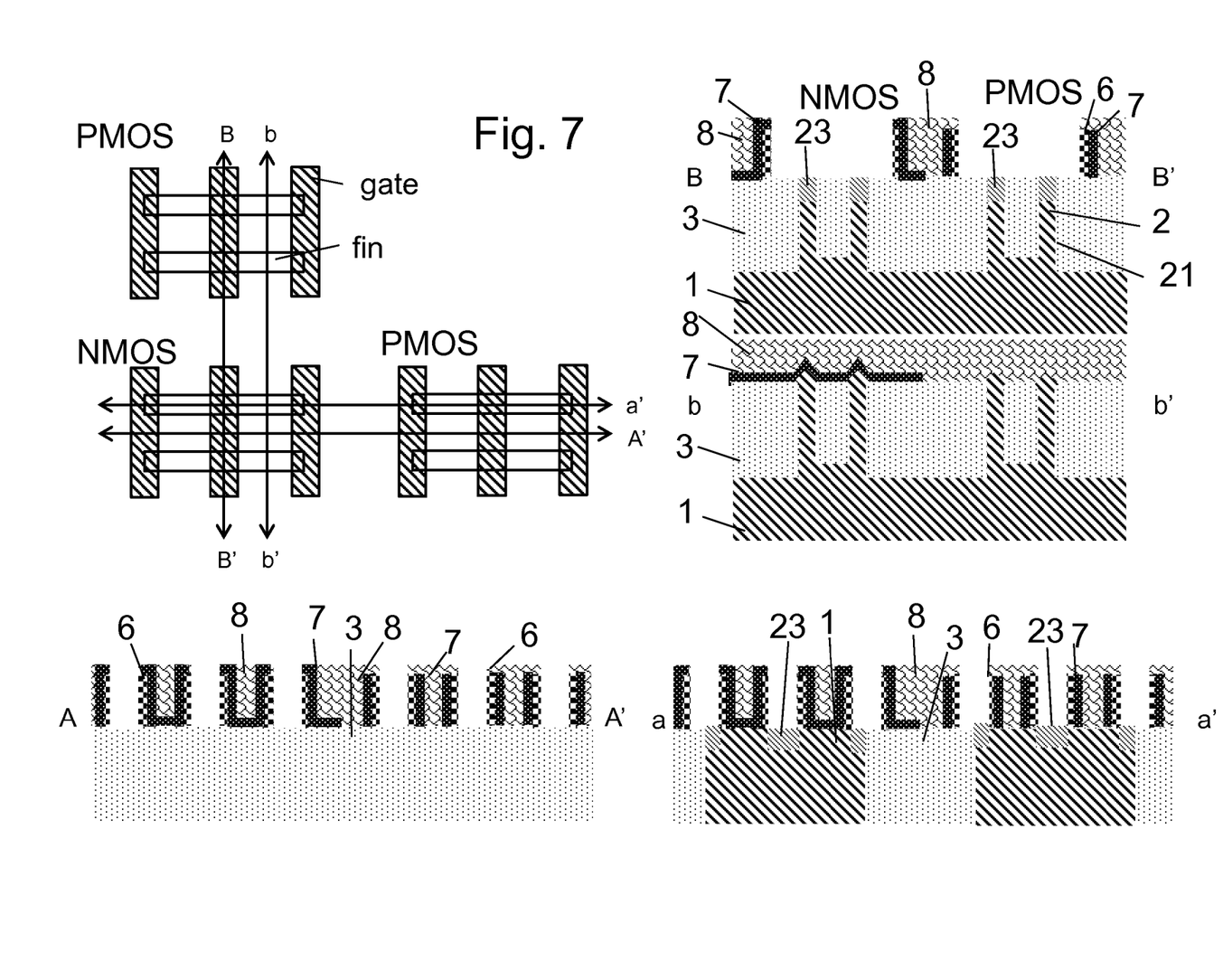

Alternatively, according to a second type of embodiment, an upper portion of the fin structures, or of at least one fin structure, can be replaced by another semiconductor material, before an upper portion of at least two shallow trench isolation structures is removed to expose at least a portion of the sidewalls 21 of the fin structures. Indeed, as illustrated in FIG. 6, the upper portion of the fins 2 can be removed, leaving respective gaps 20. In one example, this can be performed by applying a wet treatment with a tetramethylammoniumhydroxide (TMAH) solution at a temperature of 80° C. Within these gaps another, second, semiconductor layer or layer stack 23 can be grown, as illustrated in FIG. 7. Now, an upper portion of the respective adjacent shallow trench isolation structures is removed to create spaces 30, thereby exposing at least a portion of the sidewalls 21 of the respective fin structures (see FIG. 8). According to certain embodiments, an interface layer may be provided, for instance epitaxially grown, between the underlying silicon portion of the respective fins and the second semiconductor layer or layer stack.

It is a further possible advantage of embodiments of the present disclosure that, since epitaxial growth of new channel materials can be deferred to later stages of the process flow, for example after dummy gate removal, these new channel materials are subjected to less thermal treatments, which otherwise would degrade their enhanced performance foreseen for future generation CMOS devices.

Figure 8:
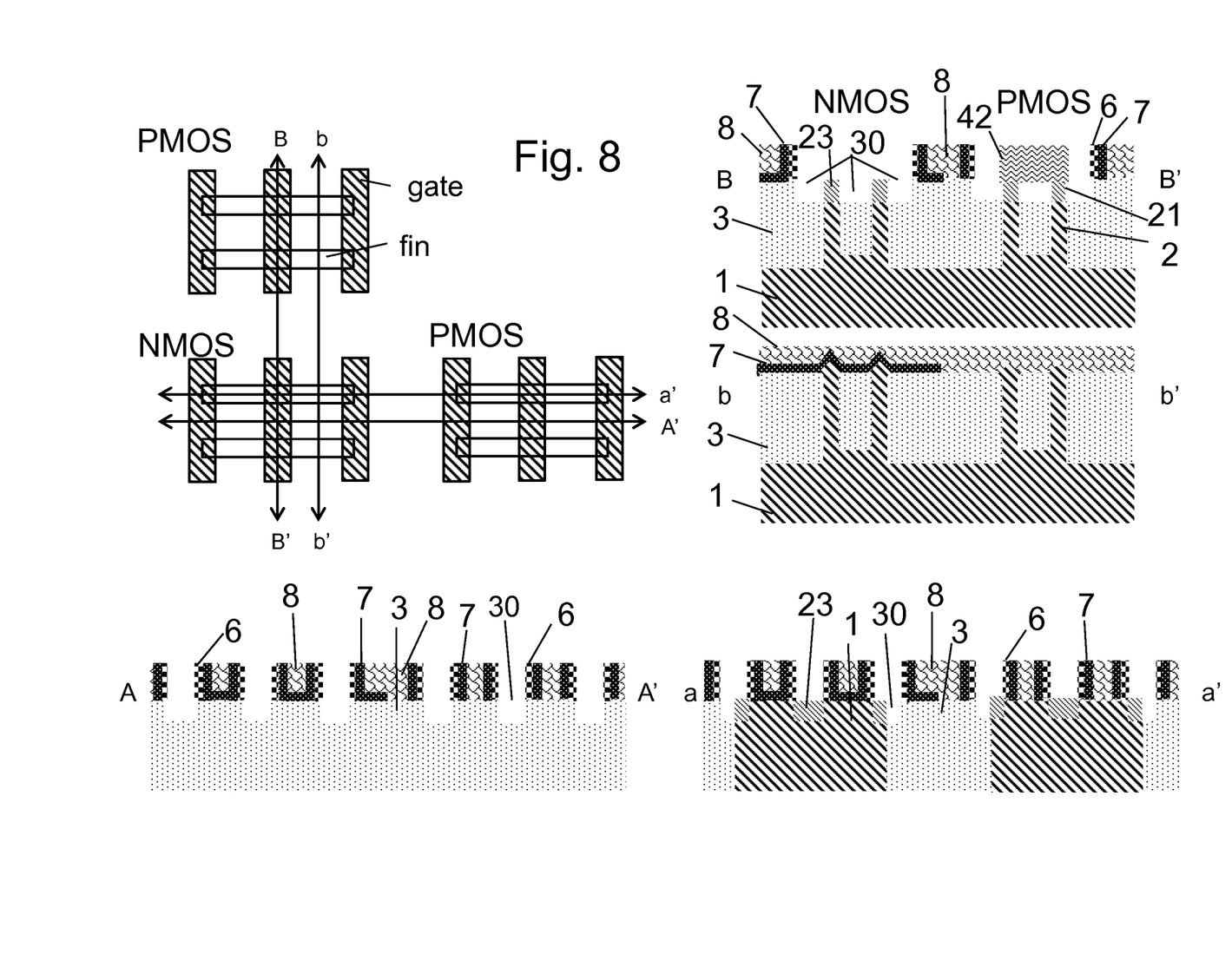

Finally, thereafter, a final gate stack 42 can be formed in the gate trench 40 (see FIG. 8, for example).

It is to be understood that the disclosure is not limited to the particular features of the means and/or the process steps of the methods described as such means and methods may vary. It is also to be understood that the terminology used herein is for purposes of describing particular embodiments only, and is not intended to be limiting. It must be noted that, as used in the specification and the appended claims, the singular forms "a" "an" and "the" include singular and/or plural referents unless the context clearly dictates otherwise. It is also to be understood that plural forms include singular and/or plural referents unless the context clearly dictates otherwise. It is moreover to be understood that, in case parameter ranges are given which are delimited by numeric values, the ranges are deemed to include these limitation values.

It will be appreciated that the method according to any of the embodiments described above, can be performed in parallel for a set of different field effect transistor structures having respective gate structures, wherein the inter-gate pitch and intra-transistor fin pitch are substantially different. The values of inter-gate pitch and intra-transistor fin pitch influence the applicability of many aspect-ratio dependent processes. The fact that these values typically differ, further complicates the application of aspect-ratio dependent processing steps on a surface with relatively larger topography. It is an advantage that postponing the actual definition of the fin structures, e.g., their becoming 3D, facilitates the use of these aspect-ratio dependent processing steps.

Further, a method for manufacturing a CMOS device is disclosed, comprising performing the method according to any of the previous embodiments in a first area (e.g., NMOS or PMOS area), and performing the method according to any of the previous embodiments in a second area (e.g., PMOS or NMOS area respectively). The first area and the second area are distinct. The method further includes removing an upper portion from the fin structures and epitaxially regrowing the upper portion of the fin structures by epitaxially growing a second semiconductor material, before removing the upper portion of the at least two shallow trench isolation structures, in at least one of the first area and the second area. By doing so, NMOS and PMOS devices based on different fin or channel materials can be provided next to each other on the same substrate.

According to further embodiments, removing an upper portion from the fin structures and epitaxially regrowing the upper portion of the fin structures by epitaxially growing a second semiconductor material, before removing the upper portion of the at least two shallow trench isolation structures, can be applied in both the first area and the second area. In the above embodiments, the second (or third) semiconductor material can for instance comprise Germanium or a III-V material.

The particular combinations of elements and features in the above detailed embodiments are provided by example only. As those skilled in the art will recognize, variations, modifications, and other implementations of what is described herein can occur to those of ordinary skill in the art without departing from the spirit and the scope of the disclosure as claimed. Accordingly, the foregoing description is by way of example only and is not intended as limiting. The disclosure's scope is defined in the following claims and the equivalents thereto. Furthermore, reference signs used in the description and claims do not limit the scope of the disclosure as claimed.

What is claimed is:

1. A method for manufacturing a field effect transistor of a non-planar type, comprising:
    providing a substrate having an initially planar front main surface;
    providing shallow trench isolation structures in the substrate on the front surface, thereby defining a plurality of fin structures in the substrate between the shallow trench isolation structures, wherein top surfaces of the shallow trench isolation structures and the fin structures are abutting on a common planar surface, and wherein sidewalls of the fin structures are fully concealed by the shallow trench isolation structures;
    forming a dummy gate structure over a central portion of the plurality of fin structures on the common planar surface;
    forming dielectric spacer structures around the dummy gate structure;
    removing the dummy gate structure, thereby leaving a gate trench defined by the dielectric spacer structures;
    removing an upper portion from the fin structures in the gate trench;
    epitaxially regrowing the removed upper portion of the fin structures; and
    after removing the dummy gate structure and after epitaxially regrowing the removed upper portion of the fin structures, removing an upper portion of at least two shallow trench isolation structures to expose at least a portion of the sidewalls of the fin structures within the gate trench, and forming a final gate stack in the gate trench.

2. The method according to claim 1, wherein the fin structures initially comprise a first semiconductor material, and wherein epitaxially regrowing the upper portion of the fin structures includes epitaxially growing a second semiconductor material at the removed upper portion of the fin structures.

3. The method according to claim 1, wherein the substrate is a bulk substrate.

4. The method according to claim 1, wherein the common planar surface has a surface profile variation that is smaller than 10 nm.

5. The method according to claim 1, further comprising performing further aspect ratio dependent processing steps before removing the dummy gate structure.

6. The method according to claim 5, wherein the aspect ratio dependent processing steps include one or more of deposition steps, etching steps, illumination steps, or implantation steps.

7. The method according to claim 1, further comprising applying a protection layer on the substrate before removing the dummy gate structure, wherein the protection layer is substantially resistant to an etching process used for recessing the shallow trench isolation structures.

8. The method according to claim 7, wherein the protection layer includes a carbon comprising silicon oxide layer.

9. The method according to claim 1, performed for a set of different field effect transistor structures having respective gate structures, in parallel, wherein the gate pitch and fin pitch of the different field effect transistor structures are different.

10. A method for manufacturing a CMOS device comprising:
   performing the method according to claim 1 in a first area; and
   performing the method according to claim 1 in a second area, wherein the first area and the second area are distinct.

11. The method according to claim 1, wherein removing the upper portion from the fin structures is performed within the gate trench and not in regions outside the gate trench.

12. The method according to claim 1, wherein the eptiaxially regrown upper portion of the fin structures is configured as a channel region of the field effect transistor.

* * * * *